United States Patent [19]

Morris et al.

[11] 4,126,487

[45] Nov. 21, 1978

[54] PRODUCING IMPROVED METAL ALLOY PRODUCTS (AL-FE ALLOY AND AL-FE-SI ALLOY)

[75] Inventors: Larry R. Morris, Yarker; John D. Thomson, Regina, both of Canada

[73] Assignee: Alcan Research and Development Limited, Montreal, Canada

[21] Appl. No.: 632,019

[22] Filed: Nov. 14, 1975

[30] Foreign Application Priority Data

Nov. 15, 1974 [GB] United Kingdom ............... 49640/74
Nov. 15, 1974 [GB] United Kingdom ............... 49641/74

[51] Int. Cl.$^2$ .............................................. C22F 1/04
[52] U.S. Cl. ...................................... 148/2; 29/527.7; 75/138; 75/148; 148/11.5 A; 148/32
[58] Field of Search ................ 75/138, 148; 148/2, 148/3, 11.5 A, 32, 32.5; 164/82, 89, 277, 282; 29/527.7

[56] References Cited

U.S. PATENT DOCUMENTS

| | | | |
|---|---|---|---|
| 3,571,910 | 3/1971 | Bylund | ........................................ 75/138 |
| 3,827,917 | 8/1974 | Zeigler et al. | ................... 148/11.5 A |
| 3,884,290 | 5/1975 | McCubbin | ............................. 164/82 |
| 3,930,895 | 1/1976 | Moser et al. | .............................. 148/2 |
| 3,938,991 | 2/1976 | Sperry et al. | .............................. 148/2 |
| 3,989,548 | 11/1976 | Morris | ............................ 148/11.5 A |

*Primary Examiner*—R. Dean
*Attorney, Agent, or Firm*—Cooper, Dunham, Clark, Griffin & Moran

[57] ABSTRACT

A dispersion strengthened aluminum alloy sheet is produced by casting an Al-Fe 1.1 – 2.5% alloy optionally containing Si up to 2.0% and, optionally, proportions of other specified alloying constituents. The alloy is cast in the form of a slab at a growth rate in excess of 25 cm/min. at a thickness of less than 25 mm so that intermetallics are formed in the slab in the form of fine rods of a diameter of 0.05 – 0.5 micron. These rods are then segmented by reducing the slab by at least 60% by rolling to develop a dispersion of fine intermetallic particles. By final annealing the rolled sheet at a temperature in the range of 250° – 400° C a sheet having a good combination of yield strength and formability is obtained (as indicated by a yield strength of greater than 15 k.s.i. and tensile elongation greater than 15%).

9 Claims, No Drawings

PRODUCING IMPROVED METAL ALLOY PRODUCTS (AL-FE ALLOY AND AL-FE-SI ALLOY)

The present invention relates to aluminum alloy products and in particular to novel means for producing dispersion-strengthened aluminum alloy products, which are essentially Al-Fe alloys. The mechanical properties of a dispersion-strengthened alloy product are governed by a fine dispersion of microscopic insoluble particles and/or by the dislocation structure or grain structure resulting from these particles. Known dispersion-strengthened alloys have useful properties, such as high strength at elevated temperatures.

It would be convenient to obtain an aluminum alloy sheet of good strength and formability characteristics from an alloy in which iron is the principal alloying constituent, because of the low cost of iron.

It has already been proposed in U.S. Pat. No. 3,397,044 to produce aluminum foil and light gauge aluminum can stock by rolling aluminum alloys containing 0.6–2.5% Fe as the essential alloying element, although small amounts of other alloying elements, notably Mg, Mn and Si may be present. The initial alloy is cast in conventional ingot form and is reduced to its final gauge by successive hot rolling and cold rolling operations.

In patent application Ser. No. 471,133 now U.S. Pat. No. 3,989,548 issued Nov. 2, 1976 there is described a procedure for producing high strength aluminum alloy sheet in which a eutectic or near-eutectic ternary aluminum alloy is cast under controlled conditions so that the intermetallic phases form into thin rods having a length many times greater than their cross section.

The alloy containing the intermetallic phase was subjected to cold working so as to fracture the relatively brittle intermetallic rods and produce a dispersion of fine intermetallic particles through the mass of the alloy.

The intermetallic phases formed not less than 5.0% by volume in the cast alloy and in most instances were produced in the form of conventional ingots (rectangular ingots having a thickness of at least 10 cm).

Al-Fe systems form eutectics at relatively low iron contents and the resulting intermetallics form less than 5.0% by volume of the cast alloy.

When Al-Fe alloy is cast under conditions found appropriate to develop rod-like intermetallics in the ternary alloy systems above referred to (conventional direct chill (D.C.) casting at 10–15 cm/min. and growth rate of 6–8 cm/min.) the Al-Fe intermetallic phase does not deposit in the desired rod-like form. Instead the Al-Fe phase appears as coarse plates or script greater than 1 micron in section and the alloy sheet obtained from rolling ingots of such alloy does not exhibit in the annealed condition a combination of high yield strength and high elongation.

We have now found that it is possible to obtain Al-Fe alloy sheet of improved properties from an Al-Fe alloy of near eutectic composition by utilizing special casting procedures which are found to be effective to solidify the intermetallic phase in the form of fine branched rods, i.e. rods in the range of about 0.05–0.5 microns in diameter.

Although the intermetallic phases form less than 5% by volume it is found that adequate strengthening is achieved when the Al-Fe alloy containing rod-like phases of the specified size is subjected to working to fracture the intermetallic rods and form a dispersion of fine particles of corresponding size.

It is also proposed in British Patent No. 1,286,720 to produce aluminum alloy conductor stock by casting a high purity aluminum, for example 99.95% aluminum, alloyed with 0.7–3.0% Fe under such rapid chilling conditions that the iron-aluminum intermetallic phase separates as small particles of a size less than 5 microns and the cells of the dendritic structure are limited to a size of less than 9 microns. The cast Al-Fe alloy was then heat treated to precipitate remaining iron from solid solution before being converted to conductor wire by standard wire drawing techniques. Although the conductor stock was chilled rapidly inrelation to the casting technique employed for comparative purposes it does not appear to have been cast under conditions leading to the deposition of an iron-aluminum phase in the form of rods at the very high growth rates employed in the process of the present invention since it is stated that the desired dendritic size and iron particle size could be achieved with cast alloy in sizes up to 6 inch × 6 inch (approximately 152 mm × 152 mm).

The present invention is concerned to produce an aluminum alloy sheet having a combination of good strength (high yield strength) and good formability (as indicated by a high precentage value of tensile elongation). This depends primarily upon stabilising a fine grain structure by the dispersion of fine particles. If the intermetallic particles are too coarse or unevenly distributed with an alloy of the present low volume of intermetallics, the grain size of the aluminum after final annealing will be too coarse. For the present purpose the grain size should be not more than about 3 microns. On the other hand, if the size of the intermetallic particles is too small the grain boundaries will by-pass the particles, the grain size will be much larger than 3 microns and although the material will have good formability it will have low yield strength.

The development of the desired structure in the cast Al-Fe alloy is, in accordance with the present invention, achieved by continuous casting the alloy under conditions which lead to a very rapid growth rate (rate of deposition of solid metal in a direction perpendicular to the solidification front) of at least 25 cm/min. The growth rate preferably does not exceed 250 cm/min. Growth rates of 25 cm/min. can only be achieved with material up to about 25 mm thickness and a requirement for higher growth rates limits the thickness of the cast material to a lower value.

In order to achieve optimum properties the continuous casting procedure employed should result in a high growth rate throughout the thickness of the cast material, so as to avoid, as far as possible, the growth of undesired coarse intermetallic particles.

It should be emphasized that, whereas a high growth rate cannot be obtained in a continuous casting operation without a high casting rate, a high casting rate does not necessarily result in a high growth rate.

In practical high-volume casting equipment the requirement of high growth rate is most easily achieved by the use of twin-roll type casters in which the molten metal is solidified in the nip of a pair of heavily chilled rolls, which draw the molten metal upwardly out of an insulated injector nozzle in close proximity to the rolls. A caster of this type is manufactured by Hunter Engineering Company of Riverside, California. Typically in casting equipment of that type the cast material is in the form of strip in a thickness range of about 0.2-0.3 inch (5-7.5 mm) and is cast at a speed of about 25-40 in./min. (about 625-1000 mm/min.). The metal is essentially fully solidified when it passes the centre line of the caster rolls and it is subjected to heavy compression as it passes through the gap between the rolls with the consequence that its surfaces are in excellent heat exchange contact with the caster rolls.

It is found that by the use of this equipment, near-eutectic Al-Fe alloys having an Fe content in the range of 1.1-2.5% can be cast in the form of a thin slab having the intermetallic phase solidified in the form of fine rods. This thin cast slab is then subjected to working to effect at least 60% reduction and preferably even greater reductions and this leads to the fragmentation of the intermetallic rods to form fine particles which are dispersed throughout the material and have the effect of stabilising a fine grain structure, as already explained. At least the final 10% reduction is by cold-rolling and preferably reduction is effected solely by cold rolling. The cold-rolled alloy is finally annealed at a temperature in the range of 250°-400° C. It is also preferred to anneal the slab at 350°-500° C. before cold-rolling.

The process of the present invention is preferably performed in connection with alloys containing no more than 2.0% Fe and more particularly with alloys having an Fe content in the range of 1.3-2.0%. The invention is concerned with alloys containing less than 5.0% volume percent intermetallics. In most cases it is preferred that the volume of intermetallic particles should exceed 2.5% volume. Thus at the lower limits of the Fe content it is preferred that the alloy should contain one or more alloying elements which will form ternary or higher order intermetallics with Al and Fe. For this puropose the alloy may contain small proportions of Si, Mn and Ni, which all form ternary phases with the Al and Fe and which are deposited in the form of rods under the specified casting conditions. Silicon may be incorporated in amounts up to 2.0%, Ni up to 1.0% and Mn up to 0.5%. The total content of intermetallic phases preferably does not exceed 5.0% by volume. Cu in amounts up to 1.0%, Mg up to 1.0% and Zn up to 2.0% may also be provided. These remain in solid solution. Other elements may be included in amounts up to 1.0% total (0.3% max. each).

The alloy sheet product of the present invention is intended to be low cost sheet material and for that reason is based on commercial purity metal of not better than 99.8% purity and more usually of 99.5-99.7% purity. Consequently, the alloy will contain at least 0.08% Si and more usually 0.1-0.3% Si without addition of Si as an alloying constituent.

In carrying out the procedure of the invention it is preferred that the alloying element content of the alloy should be somewhat below an eutectic composition in order somewhat to extend the freezing range. If the freezing range is very short, some difficulty is experienced in casting the alloy on a twin-roll caster. The addition of a small proportion of Cu and/or Mg in amount up to a total of 1% has a known strengthening effect. In addition to improving the mechanical properties of the alloy sheet, it also reduces the anisotropy between the properties in the longitudinal and transverse directions.

The procedure of the present invention is principally applicable to the production of sheet from an alloy consistng of commercial purity aluminum with Fe as the main alloying addition and usually 0.1-0.3% Cu or Mg. The total iron content is preferably in the range 1.3-2.0% Fe and most preferably 1.6-1.8%. In addition Si in amounts up to 1.5% total may be added Some advantages are found in incorporating Si in an amount of 0.5-1.2%.

The high growth rate casting procedure is very satisfactory for casting a variety of Al-Fe ternary alloys to develop a rod-like intermetallic structure, which is converted to dispersed particles by rolling the alloy, as already described.

Thus the production of sheet products is contemplated by casting a near eutectic Al-Fe binary or ternary alloy by a continuous casting procedure at a growth rate of at least 25 cm/min. and a thickness of less than 25 mm to develop intermetallic rods which are then segmented by effecting at least 60% reduction by rolling, the alloy falling within the following compositional range:

Fe 1.1 - 2.5%
Si up to 2.0%
Zn up to 2.0%
Cu up to 1.0%
Mg up to 1.0%
Ni up to 1.0%
Mn up to 0.5%
Others up to 0.3% each (up to 1.0% total)
Al balance.

The average size of the intermetallic particles will be less than 0.5 microns diameter (measured as the diameter of a sphere of equivalent volume to that of the particle). The alloy preferably includes Fe in an amount of 1.3-2.0% plus at least one additional component within the following ranges:

Si 0.1-1.5%
Zn 0.5-1.5%
Ni 0.1-0.5%
Mn 0.1-0.4%

In each case it is preferred to incorporate 0.1-0.3% Cu or 0.05-0.2% Mg to provide extra strength. Others are preferably kept below 0.3% each and 0.5% total. Zinc in the stated amount is conveniently incorporated in sheet material for use as fin stock in heat exchanger material to ensure that the material will corrode preferentially to the heat exchanger tubes. The fin stock material preferably includes a small content of manganese.

An addition of Ni in the range of 0.1 to 1.0% to an Al-Fe alloy, possibly containing Mn and Cu or Mg increases the yield strength in the annealed condition.

The sheet materials produced by a procedure requiring casting the alloy in the form of a thin slab at a growth rate of at least 25 cm/min. show a more satisfactory combination of yield strength and elongation in the annealed condition than are obtained from the same alloy when cast in ingot form by conventinal D.C. casting procedures before being converted to sheet by standard hot rolling and cold rolling operatins as exemplified in the following tables of properties of 1 mm sheet.

It will be observed that the addition of silicon provides little improvement in yield strength over the Al-Fe 1.7%-Cu 0.2% alloy, but in some circumstances the addition of Si in an amount of 0.5% or more increases the corrosion resistance of the alloy.

A combination of mechanical properties indicated by a yield strength greater than 15 k.s.i. accompanied by an average tensile elongation greater than 15% is of particular commercial interest. It will be noted that the sheet produced according to this invention will meet these requirments, while the sheet, produced from the same alloy by rolling conventional D.C. ingot, does not. case it is possible by proper control of the final annealing conditions within the range of 250°–400° C. to pro-

Al-Fe Alloys: Tensile Properties[1] 1 mm Sheet

| Material | As-Rolled | | | P.A. 300° C[2] | | | P.A. 350° C | | | P.A. 400° C | | |
|---|---|---|---|---|---|---|---|---|---|---|---|---|
| | UTS (ksi) | YS (ksi) | Elong. (%) | UTS (ksi) | YS (ksi) | Elong. (%) | UTS (ksi) | YS (ksi) | Elong. (%) | UTS (ksi) | YS (ksi) | Elong. (%) |
| A. Twin Roll Cast 1.70 Fe - 0.19 Cu - 0.15 Si | | | | | | | | | | | | |
| No Slab Anneal - | 47 | 39 | 5 | 27 | 23 | 16 | 25 | 20 | 19 | 23 | 15 | 26 |
| Slab Anneal - 450° C[3] | 43 | 35 | 6 | 23 | 19 | 22 | 22 | 16 | 21 | 20 | 12 | 22 |
| Inter Anneal - 400° C[4] | | | | 25 | 21 | 16 | 23 | 18 | 22 | | | |
| B. Standard D.C. Cast (1.68 Fe - 0.20 Cu - 0.15 Si)[5] | 36 | 28 | 9 | 21 | 9 | 30 | 20 | 8 | 32 | 19 | 9 | 31 |

Al-Fe-Si Alloys: Tensile Properties[1] 1 mm Sheet

| Material | As-Rolled | | | P.A. 250° C[2] | | | P.A. 300° C | | |
|---|---|---|---|---|---|---|---|---|---|
| | UTS (ksi) | YS (ksi) | Elong. (%) | UTS (ksi) | YS (ksi) | Elong. (%) | UTS (ksi) | YS (ksi) | Elong. (%) |
| A. Twin Roll Cast (1.7 Fe - 1.2 Si - 0.2 Cu) | | | | | | | | | |
| No Slab Anneal - | 43 | 38 | 3 | 34 | 30 | 9 | 33 | 18 | 22 |
| Slab Anneal [3] 500° C. | 42 | 36 | 4 | 25 | 20 | 19 | 21 | 12 | 29 |
| Slab Anneal 400° C - (1.7 Fe - 1.1 Si - 0.2 Cu - 0.46 Mn) | 44 | 37 | 4 | 26 | 21 | 17 | 24 | 14 | 20 |
| Slab Anneal 400° C - | 43 | 39 | 4 | 31 | 23 | 15 | 24 | 14 | 22 |
| B. Standard D.C. Cast (1.7 Fe - 1.2 Si - 0.2 Cu)[5] | 37 | 33 | 7 | 19 | 8 | 30 | 19 | 8 | 30 |

NOTE:
(1) Tensile properties from standard sheet tensile specimens: elongations measured over 5 cm gauge length.
(2) Partial anneals are 2 hours at indicated temperatures.
(3) As-cast 6 mm thick slab annealed 2 hours at temperatures listed before cold rolling to 1 mm sheet.
(4) As-cast 6 mm slab cold rolled to 4 mm, annealed at 400° C. - 1 hr. before cold rolling to 1 mm.
(5) 127 mm thick D.C. ingot preheated to 400° C., hot rolled to 6 mm, then cold rolled to 1 mm.

Twin Roll Cast material was cast at a casting rate of 75 cm/min. and a growth rate of about 50–70 cm/min. Standard D.C. Cast was cast in ingot form at a casting rate of about 9 cm/min. and a growth rate of about 6–8 cm/min.

Intermetallic phases in Twin Roll Cast slab material were branched rod-like Al-Fe (Mn) metastable phase with body-centered tetragonal structure plus rod-like α-Al-Fe(Mn)-Si phase in proportions dependent on Si content of alloy. Cross section diameter of rods were less than about 0.3 microns. No $FeAl_3$ or $FeAl_6$ or $MnAl_6$ phases were detected in the as-cast slab.

Phases in as-cast Al-Fe D.C. ingot were $FeAl_3$ or $FeAl_6$ present as coarse plates or script with thickness generally greater than 1 micron.

No great difference in mechanical properties of sheet produced by subjecting Twin Roll Cast slab to the specified rolling and annealing conditions result from variation of Fe content between 1.3 and 2.0% and Cu content between 0.1 and 0.3%. Variation of the Si content between 0 and 2.0% has little effect and in each case it is possible by proper control of the final annealing conditions within the range of 250°–400° C. to produce cold-rolled annealed sheet having a combination of yield strength in excess of 15 k.s.i. and tensile elongation greater than 15%, even when Cu is omitted entirely.

We claim:

1. A method of producing an aluminum alloy sheet product from an Al-Fe binary, ternary or higher order alloy which comprises casting the alloy in the form of a slab of a thickness less than 25 mm at a growth rate in excess of 25 cm/min. for depositing intermetallics in the form of elongated rods in a size range of 0.05–0.5 microns diameter, subjecting the cast slab to at least 60% reduction by rolling for fragmenting the intermetallic rods, said rolled sheet being subjected to final annealing at a temperature in the range of 250–400° C., for producing sheet having a yield strength greater than 15 k.s.i. and a tensile elongation greater than 15%, said alloy consisting essentially of the composition:

Fe 1.1–2.5%
Si up to 2.0%
Zn up to 2.0%
Ni up to 1.0%
Mn up to 0.5%
Cu up to 1.0%
Mg up to 1.0%
Others up to 0.3% each, up to 1% total
Al balance said alloy being castable to develop less than 5.0% by volume of intermetallics that are formed from the melt in a casting operation.

2. A method according to claim 1 in which said alloy includes Fe in an amount of 1.3-2.0% and in addition includes at least one additional component within the following ranges:
Si 0.1-1.0%
Zn 0.5-1.5%
Ni 0.1-1.0%
Mn 0.1-0.4%

3. A method according to claim 2 in which said alloy additionally includes 0.1-0.3% Cu or 0.05-0.2% Mg, other components being limited to less than 0.1% each and 0.3% total.

4. A method according to claim 1 in which said alloy consists essentially of commercial purity aluminum (Al 99.5-99.8%) and additional Fe to raise the Fe content to 1.3-2.0%.

5. A method according to claim 1 in which said slab is subjected to working solely by cold-rolling.

6. A method according to claim 1 in which the as-cast slab is annealed at a temperature of 350°-500° C. before-cold rolling.

7. A method of producing an aluminum alloy sheet from an alloy consisting essentially of Fe 1.1-2.5% and Ni 0.1-1.0% and
Si up to 1.0%
Zn up to 1.5%
Mn up to 0.5%
Cu up to 0.3%
Mg up to 0.2%
Others up to 0.3% each (up to 0.5% total)
Al balance,
said alloy being castable to develop less than 5.0% by volume of intermetallics that are formed from the melt in a casting operation, which comprises casting the alloy in the form of a slab of a thickness less than 25 mm at a growth rate in excess of 25 cm/min. for depositing intermetallics in the form of elongated rods in a size rane of 0.05-0.5 microns diameter, subjecting the cast slab to at least 60% reduction by cold-rolling for fragmenting the intermetallic rods, said cold-rolled sheet being subjected to a final annealing at a temperature in the range of 250°-400° C., for producing sheet having a yield strength greater than 15 k.s.i. and a tensile elongation greater than 15%.

8. A method according to claim 7 in which the alloy contains Fe 1.3-2.0% and Ni 0.1-0.5%.

9. An aluminum alloy rolled sheet product produced by the method of claim 1, said sheet being characterised by a grain size of less than 3 microns and a dispersion of fine intermetallic particles in the size range of 0.05-0.5 microns average diameter, said sheet exhibiting a yield strength greater than 15 k.s.i. and a tensile elongation greater than 15%.

* * * * *